(12) United States Patent
Viss et al.

(10) Patent No.: US 12,255,979 B2
(45) Date of Patent: Mar. 18, 2025

(54) CLOCK RECOVERY UNIT ADJUSTMENT

(71) Applicant: Keysight Technologies, Inc., Santa Rosa, CA (US)

(72) Inventors: Marlin E. Viss, Santa Rosa, CA (US); Mark Joseph Woodward, Santa Rosa, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 152 days.

(21) Appl. No.: 18/097,047

(22) Filed: Jan. 13, 2023

(65) Prior Publication Data

US 2024/0243896 A1   Jul. 18, 2024

(51) Int. Cl.
*G01R 31/317* (2006.01)
*H03L 7/08* (2006.01)
*H04L 7/00* (2006.01)
*G01R 31/319* (2006.01)

(52) U.S. Cl.
CPC .............. *H04L 7/00* (2013.01); *H03L 7/0807* (2013.01); *G01R 31/31727* (2013.01); *G01R 31/31919* (2013.01)

(58) Field of Classification Search
CPC ........ G01R 13/00; G01R 13/02; G01R 13/26; G01R 13/34; G01R 13/347; G01R 23/02; G01R 31/28; G01R 31/317; G01R 31/319; G01R 31/31727; G01R 31/31919; H03L 7/0807; H04L 5/00; H04L 7/00; H04L 7/033; H04L 12/26; H04L 25/06; H04L 27/00

USPC ....... 375/219, 224, 295, 316, 340, 354, 355, 375/371, 376; 702/69, 72, 189
See application file for complete search history.

(56) References Cited

U.S. PATENT DOCUMENTS

| | | | |
|---|---|---|---|
| 8,422,590 B2 | 8/2013 | Leibowitz et al. | |
| 10,887,076 B2 | 1/2021 | Lee et al. | |
| 2012/0072784 A1* | 3/2012 | Li | G06F 11/267 714/704 |
| 2022/0334180 A1* | 10/2022 | Pickerd | G01R 13/0254 |
| 2023/0213556 A1* | 7/2023 | Zivny | G01R 13/26 315/383 |

OTHER PUBLICATIONS

"Triggering Wide-BandwidthSampling Oscilloscopes For Accurate Displays of High-Speed Digital Communications Waveforms", Keysight Technologies, Application Note, Dec. 1, 2017, pp. 1-17.

* cited by examiner

*Primary Examiner* — Shawkat M Ali

(57) ABSTRACT

A controller includes a memory, a processor, and a first interface to a clock recovery unit that provides a recovered clock. When executed by the processor, instructions from the memory cause the controller to: instruct, via the first interface, the clock recovery unit at a first loop bandwidth to provide the recovered clock to a signal sampler; instruct, via the first interface, the clock recovery unit at a second loop bandwidth wider than the first loop bandwidth, to provide the recovered clock to the signal sampler; compare measurements from the signal sampler at the first loop bandwidth to measurements from the signal sampler at the second loop bandwidth; and instruct, via the first interface, the clock recovery unit at a third loop bandwidth to provide the recovered clock to the signal sampler applying adjustments based on comparing the measurements.

20 Claims, 4 Drawing Sheets

CLOCK RECOVERY UNIT ADJUSTMENT

BACKGROUND

In many high-speed communication systems, a clock signal used for data generation at a transmitter is not available at a receiver to re-time and sample data in a data signal received from the transmitter. A clock recovery unit is instead relied on by the receiver to recover the clock signal used for data generation from the data signal. A clock signal is a logic signal which oscillates between a high state and a low state at a set frequency related to the clock rate. A Baud rate is the rate at which information is transferred in a communication channel, and typically refers to the number of symbol changes per second in a data signal in the communication channel. Circuitry of the clock recovery unit uses the data signal to recreate a clock signal that is related to the transmission Baud rate. The recovered clock rate is used at the receiver to sample the data signal from the transmitter to determine the original data in the data signal, and/or to make measurements with test instrumentation on characteristics of the data signal. A predetermined data pattern may be used once or repeatedly as the data signal or as part of the data signal sent from a transmitter to a receiver to make measurements with test instrumentation.

A loop bandwidth may be a bandwidth of a phase locked loop (PLL) in the clock recovery unit. Circuitry of the clock recovery unit is set to a loop bandwidth that optimizes recovery of the clock signal used for data generation at the transmitter. A relatively higher (wider) loop bandwidth improves the ability to respond to timing variations in the data signal that are synchronous with the non-deterministic jitter (phase noise) associated with the transmitter clock. However, the relatively higher loop bandwidth also involves tracking a larger number of deterministic spectral components which are related to the data pattern and that are dependent on the circuitry of the clock recovery unit used for the implementation. These deterministic spectral components are not apparent on the transmitter clock and introduce a non-ideality on the recovered clock signal. This non-ideality causes timing variations that degrade measurement of the original data signal or signal parametric measurements. Such imperfections from the clock recovery unit are currently not remedied.

Characteristics of components of high-speed communication systems are usually set for multi-vendor interoperability and to meet test requirements. Test requirements may be established by documents that describe specific component implementation characteristics and testing procedures. An implicit goal under test requirements is that a recovered clock for test instrumentation exhibits the same random jitter (phase noise) as the transmitter clock within the loop bandwidth used by the clock recovery unit. Imperfect test instrumentation can lead to poor supplier yields and mistrust of the measurements from the test instrumentation. As one example, transmitter dispersion eye closure quaternary (TDECQ) is a specified measurement for many high speed pulse amplitude modulation 4 (PAM4) optical transmitters. The quality of the recovered clock rate impacts the transmitter dispersion eye closure quaternary (TDECQ) measurement.

In prior solutions, physical parameters of the clock rate recovery including edge thresholds, offsets, equalizers, gain blocks and bandwidth response are adjusted to reduce the impact of tracking deterministic data pattern-related spectral components. These adjustments are dependent on signal and clock rate recovery implementation and still result in unacceptable variability across test instrumentation and signal types. Measurements made at lower loop bandwidths often result in improvements to the measured parameters due to reduced tracking of deterministic components. However, a lower loop bandwidth does not track as much of the random jitter of the transmitter clock, which also can degrade results. Also, many test documents call out an explicit loop bandwidth such as 4 megahertz for measurements to be compliant. In most cases, an explicit clock from the transmitter is not available. If available, these measurements are often not compliant to measurement callouts in the test documents. Correlation between system level Bit Error Rate (BER) testing, and component level test parameters may allow additional test margin for measurements. However, the process of determining such a correlation is time-consuming, expensive and is still not compliant with many test documents. If an agreement is made between a supplier and purchaser, some tests may be omitted or substituted, but this then limits the ability to sell a component that meets interoperability requirements.

SUMMARY

According to an aspect of the present disclosure, a controller includes a memory, a processor, and a first interface to a clock recovery unit that provides a recovered clock. The memory stores instructions. The processor executes the instructions. When executed by the processor, the instructions cause the controller to: instruct, via the first interface, the clock recovery unit at a first loop bandwidth to provide the recovered clock to a signal sampler to measure a signal from a device under test; instruct, via the first interface, the clock recovery unit at a second loop bandwidth wider than the first loop bandwidth, to provide the recovered clock to the signal sampler to measure the signal from the device under test; compare measurements from the signal sampler at the first loop bandwidth to measurements from the signal sampler at the second loop bandwidth; and instruct, via the first interface, the clock recovery unit at a third loop bandwidth to provide the clock to the signal sampler applying adjustments based on comparing the measurements from the signal sampler at the first loop bandwidth to measurements from the signal sampler at the second loop bandwidth.

According to another aspect of the present disclosure, a tangible non-transitory computer-readable storage medium stores a computer program. The computer program, when executed by a processor, causes a controller to: instruct, via a first interface, a clock recovery unit at a first loop bandwidth to provide a recovered clock to a signal sampler to measure a signal from a device under test; instruct, via the first interface, the clock recovery unit at a second loop bandwidth wider than the first loop bandwidth, to provide the recovered clock to the signal sampler to measure the signal from the device under test; compare measurements from the signal sampler at the first loop bandwidth to measurements from the signal sampler at the second loop bandwidth; and instruct, via the first interface, the clock recovery unit at a third loop bandwidth to provide the recovered clock to the signal sampler applying adjustments based on comparing the measurements from the signal sampler at the first loop bandwidth to measurements from the signal sampler at the second loop bandwidth.

According to another aspect of the present disclosure, a system includes a clock recovery unit; and a controller. The controller includes: a first interface to a clock recovery unit that provides a recovered clock; a memory that stores instructions; and a processor that executes the instructions.

When executed by the processor, the instructions cause the controller to: instruct, via the first interface, the clock recovery unit at a first loop bandwidth to provide the recovered clock to a signal sampler to measure a signal from a device under test; instruct, via the first interface, the clock recovery unit at a second loop bandwidth wider than the first loop bandwidth, to provide the recovered clock to the signal sampler, to measure the signal from the device under test; compare measurements from the signal sampler at the first loop bandwidth to measurements from the signal sampler at the second loop bandwidth; and instruct, via the first interface, the clock recovery unit at a third loop bandwidth to provide the recovered clock to the signal sampler applying adjustments based on comparing the measurements from the signal sampler at the first loop bandwidth to measurements from the signal sampler at the second loop bandwidth.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
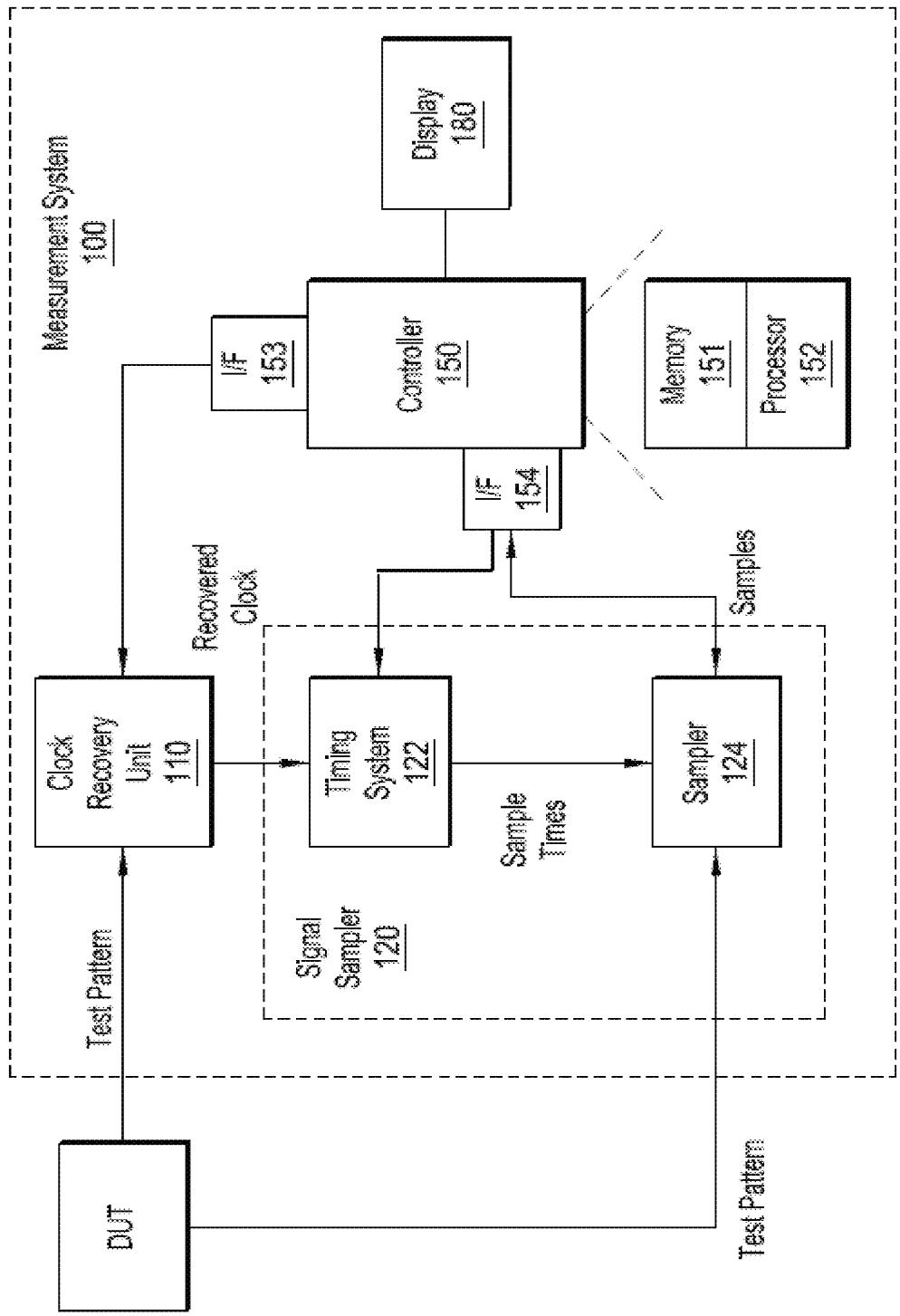
FIG. 1 illustrates a system for clock recovery unit adjustment, in accordance with a representative embodiment.

In the following detailed description, for the purposes of explanation and not limitation, representative embodiments disclosing specific details are set forth in order to provide a thorough understanding of embodiments according to the present teachings. However, other embodiments consistent with the present disclosure that depart from specific details disclosed herein remain within the scope of the appended claims. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. Definitions and explanations for terms herein are in addition to the technical and scientific meanings of the terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the inventive concept.

As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below.

As described for various embodiments herein, non-ideal edge detection in a clock recovery unit may be compensated so as to improve data waveform reconstruction and measurements. Among the benefits of the adjustments taught herein for a variety of embodiments, clock recovery unit adjustment enables minimized tracking of deterministic spectral components within a clock recovery loop bandwidth, while maintaining a proper loop bandwidth for non-deterministic random jitter and minimally impacting measurement throughput. Non-ideal edge detection in a clock recovery unit may therefore be compensated for improved data waveform reconstruction and measurements. The teachings herein provide an ability to meet requirements for standards set in test documents and minimize the need for perfect clock recovery hardware while reducing variability of measurements across different signal types and across test instrumentation.

FIG. 1 illustrates a measurement system 100 for clock recovery unit adjustment, in accordance with a representative embodiment.

The measurement system 100 in FIG. 1 is a system for clock recovery unit adjustment and includes components that may be largely or entirely provided together during use. The measurement system 100 includes a clock recovery unit 110, a signal sampler 120, a controller 150 and a display 180. The signal sampler 120 includes a timing system 122 and a sampler 124. The controller 150 includes a memory 151, a processor 152, a first interface 153, and a second interface 154. The measurement system 100 is used to characterize data from a device under test (DUT). The measurement system 100 is used to measure and correct a data pattern-synchronous timing distortion present in the clock recovery unit 110 based on measurements of a test pattern which includes the data from the DUT.

The clock recovery unit 110 receives a data signal with a test pattern from the DUT and instructions from the controller 150 via the first interface 153, and provides a recovered clock based on the test pattern to the signal sampler 120. The clock recovery unit 110 uses a loop bandwidth to receive the test pattern from the DUT. The loop bandwidth may be a bandwidth of a phase locked loop (PLL) in the clock recovery unit, and may be specified along with a nominal data rate by the instructions from the controller 150. The clock recovery unit 110 tracks jitter that occurs at a frequency below the loop bandwidth setting. A PLL with a lower (narrower) loop bandwidth will not respond as quickly to timing variations in a data signal as compared to a higher (wider) loop bandwidth. As a result, a clock recovered by the clock recovery unit 110 using the lower loop bandwidth is expected to be closer to an ideal clock that does not vary over time, and may reveal more jitter in the data signal with the test pattern.

In some embodiments, the clock recovery unit 110 may be initially locked at a low loop bandwidth. The values of the low loop bandwidth may take into account the lowest frequency components of the repeating data pattern from the DUT. As an example, if the data pattern length is 65535 symbols and the baud rate is 53.125 GBd, then the lowest frequency component of the deterministic pattern from the DUT is 53.125e9/65,535=811 kHz. The lowest frequency of the low loop bandwidth may be lower than 811 kHz in this example. The data pattern from the DUT may be divided into blocks of symbols, with blocks spaced throughout the data pattern. Each block may contain multiple symbol transitions from which timing information can be obtained.

The signal sampler 120 samples the test pattern from the DUT using sample times derived from the recovered clock. The timing system 122 receives the recovered clock based on the test pattern from the clock recovery unit 110 and instructions from the controller 150 via the second interface 154. The timing system 122 provides sample times to the sampler 124. The sample times are derived from the recovered clock received from the clock recovery unit 110. The sampler 124 receives the test pattern from the DUT and the sample times from the timing system 122, and samples the test pattern from the DUT at the sample times. The sampler 124 provides measurements as samples to the controller 150 via the second interface 154. The sampler 124 of the signal sampler 120 collects samples within each block in the data signal. The sample spacing within each block may be small enough to capture the frequency content of the signal from the DUT satisfying the Nyquist criterion. For example, if the maximum expected frequency component of the signal from the DUT is 50 GHZ, the sample rate within the block needs to be at least 100 GHz, or 10 ps sample spacing. In some embodiments, this sample rate is substantially increased to aid in identification of edge positions.

The controller 150 performs logical operations to control the signal sampler 120, the display 180 and the clock recovery unit. The memory 151 of the controller 150 stores instructions, and the processor 152 of the controller 150 executes the instructions. The second interface 154 of the controller 150 is shown as two separate elements, but may comprise a single interface that performs the functions attributed to the second interface 154 herein or multiple interfaces that perform the functions attributed to the second interface 154 herein. The controller 150 may be provided together with the signal sampler 120 as elements of an oscilloscope, or the controller 150 may be provided externally to an oscilloscope that includes the signal sampler 120. The controller 150 provides instructions to the clock recovery unit 110 via the first interface 153. The controller 150 also receives samples from the sampler 124 of the signal sampler 120 via the second interface 154, and provides instructions to the timing system 122 and to the sampler 124 via the second interface 154. The controller 150 may provide instructions to the clock recovery unit 110 to provide a clock to the signal sampler 120 at a first loop bandwidth, at a second loop band wider than the first loop bandwidth, and at a third loop bandwidth where adjustments are applied based on comparing measurements from signal sampler 120 at the first loop bandwidth to measurements from the signal sampler 120 at the second loop bandwidth. The adjustments are used to correct errors introduced by the clock recovery unit 110. The adjustments to the loop bandwidth of the clock recovery unit 110 is used to set the bandwidth desired for the random/asynchronous jitter or required by the applicable standard. As a result, non-ideal edge detection in the clock recovery unit 110 may be compensated so as to improve data waveform reconstruction and measurements.

The controller 150 may include interfaces including a first interface 153, a second interface 154, a third interface (not shown), and a fourth interface (not shown). One or more of the interfaces may include ports, disk drives, wireless antennas, or other types of receiver circuitry that connect the controller 150 to other electronic elements including the clock recovery unit 110, the signal sampler 120 and the display 180. One or more of the interfaces may also include user interfaces such as buttons, keys, a mouse, a microphone, a speaker, a display separate from the display 180, or other elements that users can use to interact with the controller 150 such as to enter instructions and receive output. For example, the controller may include a first interface 153 to the clock recovery unit 110 that provides a recovered clock, a second interface 154 to the timing system 122 and to the sampler 124 of the signal sampler 120, and a third interface to the display 180.

The controller 150 may perform some of the operations described herein directly and may implement other operations described herein indirectly. For example, the controller 150 may indirectly control operations such as by generating and transmitting content to be displayed on the display 180. The controller 150 may directly control other operations such as logical operations performed by the processor 152 executing instructions from the memory 151 based on the instructions in the memory 151, the samples received from the sampler 124, and/or input received from electronic elements and/or users via the interfaces. Accordingly, the processes implemented by the controller 150 when the processor 152 executes instructions from the memory 151 may include steps not directly performed by the controller 150.

The display 180 may be local to the controller 150 or may be remotely connected to the controller 150. The display 180 may be connected to the controller 150 via a local wired interface such as an Ethernet cable or via a local wireless interface such as a Wi-Fi connection. The display 180 may be interfaced with user input devices by which users can input instructions, including mouses, keyboards, thumbwheels and so on. The display 180 may be a monitor such as a computer monitor, a display on a mobile device, an augmented reality display, or another screen configured to display electronic imagery. The display 180 may also include one or more input interface(s) such as those noted above that may connect to other elements or components, as well as an interactive touch screen configured to display prompts to users and collect touch input from users.

As set forth above with respect to FIG. 1, the controller 150 may include a first interface 153 to a clock recovery unit 110 that provides a recovered clock; a memory 151 that stores instructions; and a processor 152 that executes the instructions. When executed by the processor 152, the instructions cause the controller 150 to: instruct, via the first interface 153, the clock recovery unit 110 at a first loop bandwidth to provide the recovered clock to a signal sampler 120 to measure a signal from a device under test; instruct, via the first interface 153, the clock recovery unit 110 at a second loop bandwidth wider than the first loop bandwidth, to provide the recovered clock to the signal sampler 120, to measure the signal from the device under test; compare measurements from the signal sampler 120 at the first loop bandwidth to measurements from the signal sampler 120 at the second loop bandwidth; and instruct, via the first interface 153, the clock recovery unit 110 at a third loop bandwidth to provide the recovered clock to the signal sampler 120 where adjustments are applied based on comparing the measurements from the signal sampler 120 at the first loop bandwidth to measurements from the signal sampler 120 at the second loop bandwidth. As a result, existing non-ideal edge detection in the clock recovery unit 110 may be compensated so as to improve data waveform reconstruction and measurements.

The process implemented by the controller 150 may include more than one comparisons and more than three loop bandwidths. For example, the adjustments to new loop bandwidths may be performed until measurements meet a predetermined criteria, such as a criteria set in a test document.

As set forth above, the controller 150 is used to implement the methods described herein. A memory described herein (e.g., memory 151) may include a main memory and/or a static memory, where such memories may communicate with each other and other components of a controller via one or more buses. The memory stores instructions used to implement some or all aspects of methods and processes described herein. The memory may be implemented by any number, type and combination of random access memory (RAM) and read-only memory (ROM), for example, and may store various types of information, such as software algorithms, which serve as instructions, which when executed by a processor cause the controller 150 to perform various steps and methods according to the present teachings. Furthermore, updates to the methods and processes described herein may also be stored in memory.

The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, Blu-ray disk, a universal serial bus (USB) drive, or any other form of storage medium known in the art. The memory 151 is a tangible storage medium for storing data and executable software instructions, and are non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 151 may store software instructions and/or computer readable code (collectively referred to as 'instructions') that enable performance of various functions of the measurement system 100 or other systems described herein for other embodiments. The memory 151 may be secure and/or encrypted, or unsecure and/or unencrypted. A computer readable storage medium is defined to be any medium that constitutes patentable subject matter under 35 U.S.C. § 101 and excludes any medium that does not constitute patentable subject matter under 35 U.S.C. § 101. Examples of such media include non-transitory media such as computer memory devices that store information in a format that is readable by a computer or data processing system. More specific examples of non-transitory media include computer disks and non-volatile memories.

The controller 150 described herein is representative of one or more processing devices, and is configured to execute software instructions stored in memory 151 to perform functions as described in the various embodiments herein. The processor 152 may be implemented by field programmable gate arrays (FPGAs), application specific integrated circuits (ASICs), systems on a chip (SOC), a general purpose computer, a central processing unit, a computer processor, a microprocessor, a graphics processing unit (GPU), a microcontroller, a state machine, programmable logic device, or combinations thereof, using any combination of hardware, software, firmware, hard-wired logic circuits, or combinations thereof. Additionally, any processing unit or processor herein may include multiple processors, parallel processors, or both. Multiple processors may be included in, or coupled to, a single device or multiple devices.

The term "processor" as used herein encompasses an electronic component able to execute a program or machine executable instruction. References to a device comprising "a processor" should be interpreted to include more than one processor or processing core, as in a multi-core processor. A processor may also refer to a collection of processors within a single computer system or distributed among multiple computer systems, such as in a cloud-based or other multi-site application. The term computing device should also be interpreted to include a collection or network of computing devices each including a processor or processors.

Figure 2A:
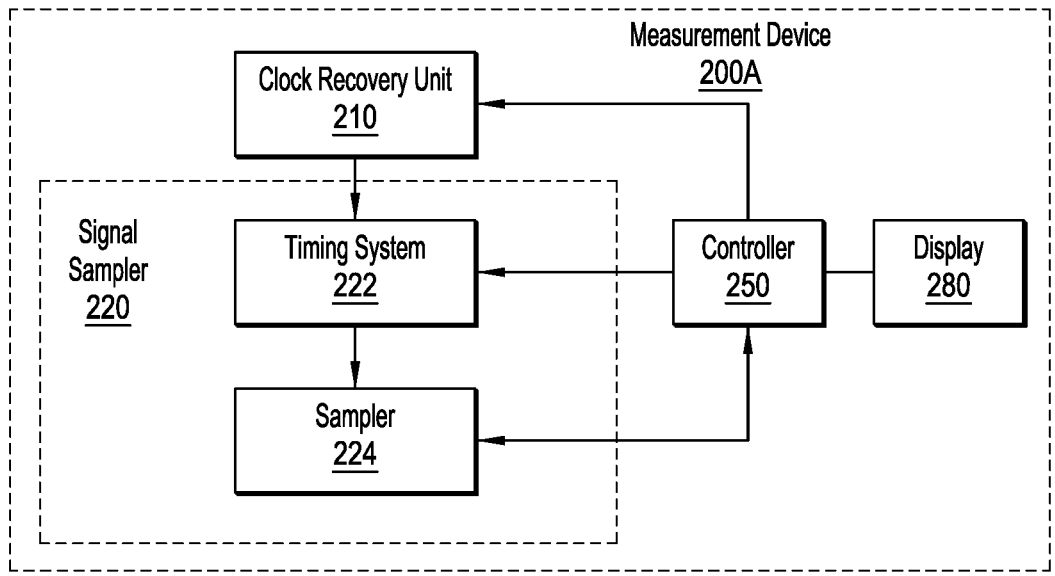
FIG. 2A illustrates another system for clock recovery unit adjustment, in accordance with a representative embodiment.

FIG. 2A illustrates another system for clock recovery unit adjustment, in accordance with a representative embodiment.

The system in FIG. 2A shows a measurement device 200A. The measurement device 200A includes a clock recovery unit 210, a signal sampler 220, a controller 250, and a display 280. The signal sampler 220 includes a timing system 222 and the sampler 224. Although not shown, the controller 250 may include a memory that stores instructions and a processor that executes the instructions. The measurement device 200A in FIG. 2A may correspond to the measurement system 100 in FIG. 1, but the measurement device 200 may comprise an individual integrated device or apparatus wherein the clock recovery unit 210 is provided as a component of the measurement device 200A. The measurement device 200A in FIG. 2A may operate in the manner described for the measurement system 100 in FIG. 1, but with the clock recovery unit 210 provided in the same device (e.g., the same housing) as the signal sampler 220 and the controller 250.

Figure 2B:
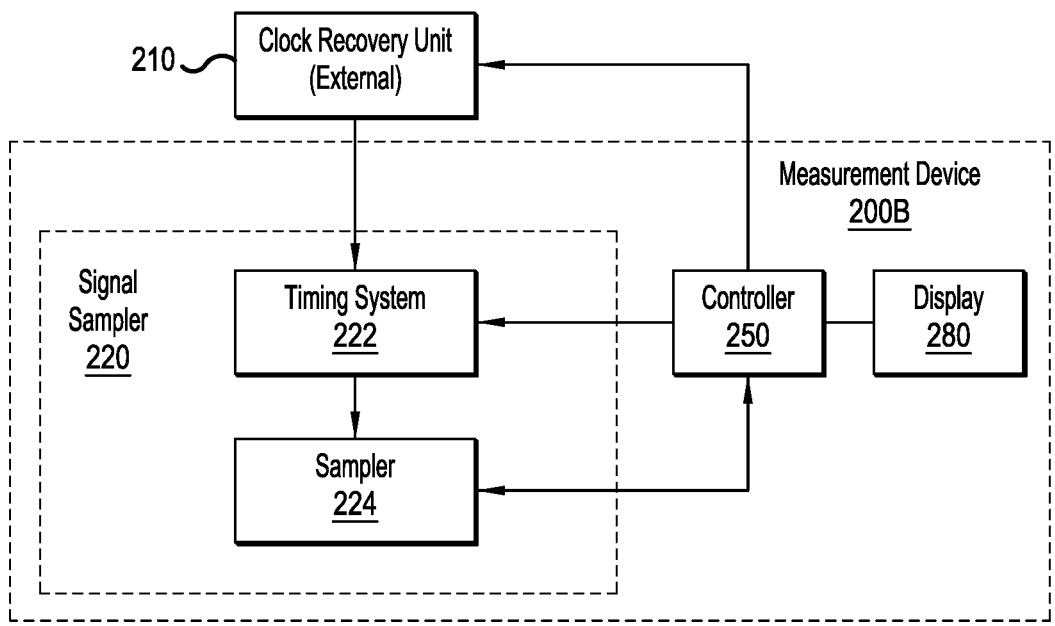
FIG. 2B illustrates another system for clock recovery unit adjustment, in accordance with a representative embodiment.

FIG. 2B illustrates another system for clock recovery unit adjustment, in accordance with a representative embodiment.

The system in FIG. 2B shows a measurement device 200B and a separate instance of the clock recovery unit 210. The measurement device 200B includes the signal sampler 220, the controller 250, and the display 280. The signal sampler 220 includes the timing system 222 and the sampler 224. Although not shown, the controller 250 may include a memory that stores instructions and a processor that executes the instructions. The measurement device 200B in FIG. 2B may correspond to the measurement system 100 in FIG. 1, but the measurement device 200B does not include the clock recovery unit 210, and instead the clock recovery unit 210 is external to the measurement device 200B. The measurement device 200B in FIG. 2B may operate in the manner described for the measurement system 100 in FIG. 1, but with the clock recovery unit 210 provided external to the device or devices that include the signal sampler 220 and the controller 250.

Figure 3:
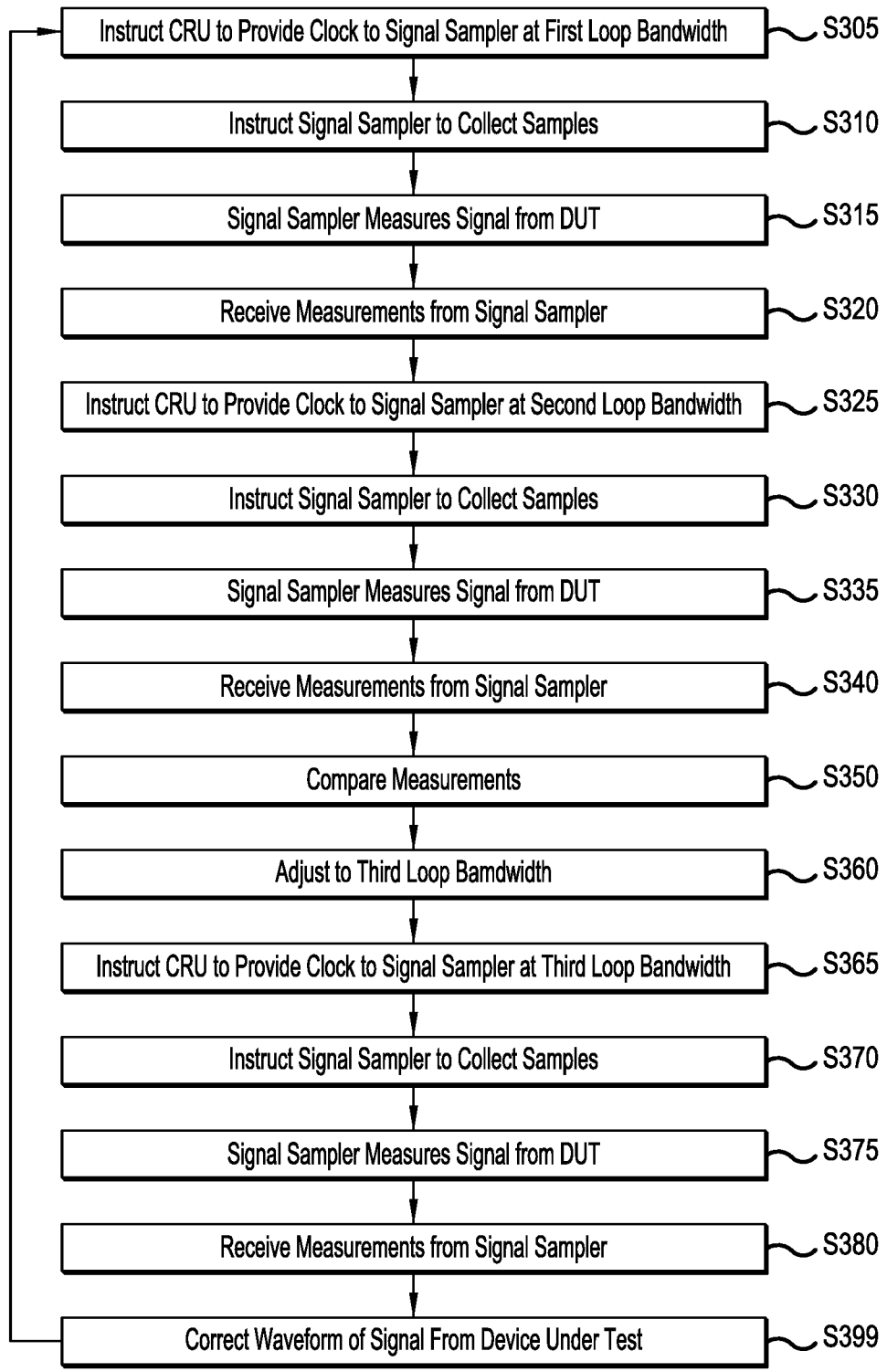
FIG. 3 illustrates a method for clock recovery unit adjustment, in accordance with a representative embodiment.

FIG. 3 illustrates a method for clock recovery unit adjustment, in accordance with a representative embodiment.

The method of FIG. 3 may be performed by the measurement system 100, the measurement device 200A, or the measurement device 200B and the clock recovery unit 210 external to the measurement device 200B. For example, the method of FIG. 3 may be performed by the measurement system 100 including the clock recovery unit 110, the signal sampler 120, the controller 150 and the display 180. The method of FIG. 3 is used to measure and correct deterministic timing distortion present in a clock recovery unit such as the clock recovery unit 110. As a result, existing non-ideal edge detection in the clock recovery unit 110 or the clock recovery unit 210 may be compensated so as to improve data waveform reconstruction and measurements.

At S305, the method of FIG. 3 starts by instructing a clock recovery unit (CRU) to provide a clock to a signal sampler at a first loop bandwidth. The controller 150 may instruct the clock recovery unit 110 to provide the recovered clock via the first interface 153 at S305. The first loop bandwidth may comprise a relatively low loop bandwidth, and the clock recovery unit 110 may be locked at the low loop bandwidth. The value should be low relative to the lowest frequency components of the repeating data pattern from the DUT. As an example, if the data pattern length is 65535 symbols and the baud rate is 53.125 GBd, then the lowest frequency component of the deterministic pattern from the DUT is 53.125e9/65,535=811 kHz. The lowest frequency of the low loop bandwidth may be lower than 811 kHz in this example.

At S310, the method of FIG. 3 includes instructing the signal sampler to collect samples. The controller 150 may instruct the signal sampler 120 to collect samples via the second interface 154 at S310. The data pattern from the DUT may be divided into blocks of symbols, and the blocks may be spaced throughout the data pattern. Each block may contain multiple symbol transitions from which timing information can be obtained.

At S315, the method of FIG. 3 includes the signal sampler measuring signals from a device under test (DUT) to obtain samples. The sampler 124 of the signal sampler 120 may measure signals from the DUT at S315 by measuring values of the data signals from the device under test (DUT) at the sample times provided by the timing system 122. The measuring by the signal sampler 120 may be used to identify symbol transitions and obtain timing information from the symbol transitions. The sampler 124 of the signal sampler 120 collects samples within each block in the data signal. The sample spacing within each block may be small enough to capture the frequency content of the signal from the DUT satisfying the Nyquist criterion. For example, if the maximum expected frequency component of the signal from the DUT is 50 GHZ, the sample rate within the block needs to be at least 100 GHz, or 10 ps sample spacing. In some embodiments, this sample rate may be substantially increased to aid in identification of edge positions.

At S320, the method of FIG. 3 includes receiving measurements from the signal sampler. The controller 150 may receive measurements of samples from the sampler 124 of the signal sampler 120 via the second interface 154 at S320.

At S325, the method of FIG. 3 includes instructing the clock recovery unit (CRU) at a second loop bandwidth to provide a recovered clock to a signal sampler. The second loop bandwidth may be wider than the first loop bandwidth. The second loop bandwidth may be 4 megahertz (MHz), for example. The controller 150 may instruct the clock recovery unit 110 to provide the recovered clock via the first interface 153 at S325. The loop bandwidth of the clock recovery unit 110 is adjusted to the bandwidth desired for the random/asynchronous jitter or required by the applicable standard.

At S330, the method of FIG. 3 includes instructing the signal sampler to collect samples. The controller 150 may instruct the signal sampler 120 to collect samples via the second interface 154 at S330. The samples collected at S330 are within the blocks of symbols in the data signal at the second loop bandwidth which is higher than the first loop bandwidth.

At S335, the method of FIG. 3 includes the signal sampler measuring signals from the DUT. The sampler 124 of the signal sampler 120 may measure signals from the DUT at S335. For example, the sampler 124 may measure signals which include the test pattern from the DUT at specified intervals corresponding to the sample times provided by the timing system 122.

At S340, the method of FIG. 3 includes receiving measurements from the signal sampler. The controller 150 may receive measurements of samples from the sampler 124 of the signal sampler 120 via the second interface 154 at S340. The measurements may comprise values of the data signal from the DUT, and also may comprise a sequence number or other indication of absolute or relative timing of when the data signal was measured.

Figure 4:
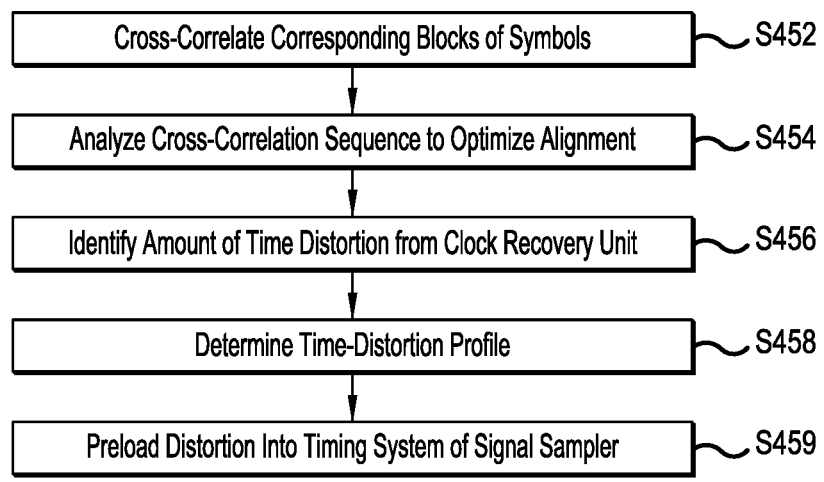
FIG. 4 illustrates a sub-process for determining waveform correction, in accordance with a representative embodiment.

At S350, the method of FIG. 3 includes comparing measurements from the signal sampler at the first loop bandwidth to measurements from the signal sampler at the second loop bandwidth. The controller 150 may compare measurements of samples from the sampler 224 of the signal sampler 220 at the first loop bandwidth and at the second loop bandwidth at S350. FIG. 4 is described below, and includes a sub-process for the comparison that is performed at S350. The output of the comparison at S350 includes the time-distortion profile described herein.

At S360, the method of FIG. 3 includes adjusting to a third loop bandwidth. The controller 150 may instruct the clock recovery unit 110 at a third loop bandwidth to provide the recovered clock to the signal sampler 120 where adjustments are applied based on comparing the measurements from the signal sampler 120 at the first loop bandwidth to measurements from the signal sampler 120 at the second loop bandwidth at S360.

At S365, the method of FIG. 3 includes instructing the clock recovery unit (CRU) at a third loop bandwidth to provide the recovered clock to the signal sampler. The controller 150 may instruct the clock recovery unit 110 to provide the recovered clock via the first interface 153 at S365. The controller 150 may provide instructions to the clock recovery unit 110 at a third loop bandwidth to provide a recovered clock to the signal sampler 120.

At S370, the method of FIG. 3 includes instructing the signal sampler to collect samples. The controller 150 may instruct the signal sampler 120 to collect samples via the second interface 154 at S370.

At S375, the method of FIG. 3 includes the signal sampler measuring signals from the DUT. The sampler 124 of the signal sampler 120 may measure signals from the DUT at S375.

At S380, the method of FIG. 3 includes receiving measurements from the signal sampler. The controller 150 may receive measurements of samples from the sampler 124 of the signal sampler 120 via the second interface 154 at S380.

At S399, the method of FIG. 3 includes correcting the waveform of a signal from the device under test (DUT). After S399, the method of FIG. 3 includes returning to S305. A data pattern-distortion profile determined at S458 in FIG. 4 and described below may be preloaded at S459 so as to correct waveforms received and processed through the clock recovery unit 110 in post-processing at S399. In other embodiments, if allowed by a waveform acquisition system, the distortion may be pre-loaded as timebase correction terms. In the corrected waveform resulting from S399, non-ideal edge detection in a clock recovery unit such as the clock recovery unit 110 may be compensated so as to improve data waveform reconstruction and measurements.

For embodiments herein, the first loop bandwidth is primarily described as narrower than the second loop bandwidth. However, in the method of FIG. 3 and other embodiments herein, the order could be reversed so that the first loop bandwidth used for measurements at S315 is wider than the second loop bandwidth used for measurements at S335.

Additionally, the third loop bandwidth is primarily described herein as an adjustment from the second loop bandwidth. However, the third loop bandwidth may have the same width as the wider of the first loop bandwidth and the second loop bandwidth. The adjustments may be applied to the loop bandwidth, but may also be applied to the measured values from the signal sampler. In some embodiments, adjustments may be made based on the first two measurement conditions, but the adjustments may be applied in various ways as described herein.

FIG. 4 illustrates a sub-process for determining waveform correction, in accordance with a representative embodiment.

In FIG. 4, S452 through S459 may be implemented as or between S350 and S360 in FIG. 3 according to the embodiment of FIG. 4. At S452, the method of FIG. 4 includes cross-correlating corresponding blocks of symbols. The corresponding blocks of symbols may be from the measurements received at S320 and the measurements from S340 in FIG. 4. S452 may be performed by the controller 150 in FIG. 1. The cross-correlation of each block of symbols in a first sequence from the first acquisition at the first loop bandwidth at S315 (i.e., using the low loop bandwidth) with the corresponding block of symbols in a second sequence from the second acquisition at the second bandwidth at S335 (i.e., using the high loop bandwidth) results in a cross-correlation sequence. The cross-correlation sequence is analyzed to determine the time alignment between the first sequence and the second sequence. The alignment reveals the amount of time distortion introduced by a clock recovery unit such as the clock recovery unit 110 for that block.

At S454, the method of FIG. 4 includes analyzing the cross-correlation sequence to determine the time alignment. S454 may be performed by the controller 150 in FIG. 1.

At S456, the method of FIG. 4 includes identifying an amount of time distortion from the clock recovery unit. The amount of time distortion from the clock recovery unit is an amount of time distortion attributable to a clock recovery unit such as the clock recovery unit 110 in FIG. 1. S456 may be performed by the controller 150 in FIG. 1.

At S458, the method of FIG. 4 includes determining a time-distortion profile based on the amount of time distortion identified from the clock recovery unit at S456. The determination of the time-distortion profile at S458 may include calculations by the controller 150 in FIG. 1. The entire pattern-distortion profile determined at S458 may be determined by using interpolation between the values determined for each block. The controller 150 may determine a time-distortion profile for the signal from the device under test using interpolation between values determined for each block.

At S459, the method of FIG. 4 includes preloading distortion into a timing system of a signal sampler. S459 may be performed by the controller 150 preloading distortion into the timing system 122 of the signal sampler 120. The controller 150 may preload distortion into a timing system of the signal sampler based on the time-distortion profile determined at S458, so as to correct waveforms received and processed through the clock recovery unit 110 in post-processing. In other embodiments, the distortion may be pre-loaded as timebase correction terms.

In one set of embodiments with a variation from the teachings above, rather than dividing a waveform into discrete blocks to be acquired, the entire repeating waveform may be acquired twice. This replaces or reduces the number of individual measurements required at S315, S335 and S375. The first acquisition may be the first loop bandwidth (i.e., the low loop bandwidth) and the second acquisition may be at the high loop bandwidth. The alignment and correction may be performed in post-processing at S399.

In another set of embodiments with a variation from the teachings above, alternatives to cross-correlation at S452 may be used to determine the time deviation within each block. Other techniques may include determining threshold crossings or finding peaks in derivative of signals.

In still another set of embodiments with a variation from the teachings above, frequency content of distortion may have limits. For example, if the clock recovery unit 110 design includes a voltage controlled oscillator (VCO), the voltage controlled oscillator may have an upper bandwidth limit. The data pattern-distortion profile may be filtered based on this expected frequency content in order to reduce the uncertainty of the distortion. For example, if the voltage controlled oscillator has a maximum modulation bandwidth of 100 MHz, the data pattern-distortion profile may be band-limited to 100 MHz.

In an embodiment, dedicated hardware implementations, such as application-specific integrated circuits (ASICs), field programmable gate arrays (FPGAs), programmable logic arrays and other hardware components, are constructed to implement one or more of the methods described herein. One or more embodiments described herein may implement functions using two or more specific interconnected hardware modules or devices with related control and data signals that can be communicated between and through the modules. Accordingly, the present disclosure encompasses software, firmware, and hardware implementations. Nothing in the present application should be interpreted as being implemented or implementable solely with software and not hardware such as a tangible non-transitory processor and/or memory.

In accordance with various embodiments of the present disclosure, the methods described herein may be implemented using a hardware computer system that executes software programs. Further, in an exemplary, non-limited embodiment, implementations can include distributed processing, component/object distributed processing, and parallel processing. Virtual computer system processing may implement one or more of the methods or functionalities as described herein, and a processor described herein may be used to support a virtual processing environment.

As set forth above, clock recovery unit adjustment enables minimized tracking of deterministic spectral components within the clock recovery loop bandwidth and attributable to the clock recovery unit, while maintaining a proper loop bandwidth for capturing non-deterministic random jitter and attributable to the transmitter, all while minimally impacting measurement throughput. Non-ideal edge detection in a clock recovery unit may therefore be compensated for improved data waveform reconstruction and measurements. The teachings herein provide an ability to meet requirements for standards set in test documents and minimize the need for perfect clock recovery hardware while reducing variability of measurements across different signal types and across test instrumentation. Moreover the teachings herein provide an improvement for measurement of component transmitter dispersion eye closure quaternary (TDECQ), which increases supplier yields.

Although clock recovery unit adjustment has been described with reference to several exemplary embodiments, it is understood that the words that have been used are words of description and illustration, rather than words of limitation. Changes may be made within the purview of the appended claims, as presently stated and as amended, without departing from the scope and spirit of clock recovery unit adjustment in its aspects. Although clock recovery unit adjustment has been described with reference to particular means, materials and embodiments, clock recovery unit adjustment is not intended to be limited to the particulars disclosed; rather clock recovery unit adjustment extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. A controller, comprising:
   a first interface to a clock recovery unit that provides a recovered clock from the first interface to the clock recovery unit;
   a memory that stores instructions; and
   a processor that executes the instructions, wherein, when executed by the processor, the instructions cause the controller to:
   instruct, via the first interface, the clock recovery unit at a first loop bandwidth to provide the recovered clock to a signal sampler to measure a signal from a device under test;
   instruct, via the first interface, the clock recovery unit at a second loop bandwidth wider than the first loop bandwidth to provide the recovered clock to the signal sampler to measure the signal from the device under test;
   compare measurements from the signal sampler at the first loop bandwidth to measurements from the signal sampler at the second loop bandwidth; and
   instruct, via the first interface, the clock recovery unit at a third loop bandwidth to provide the recovered clock to the signal sampler applying adjustments based on comparing the measurements from the signal sampler at the first loop bandwidth to measurements from the signal sampler at the second loop bandwidth.

2. The controller of claim 1, further comprising:
   a second interface to the signal sampler, wherein the measurements from the signal sampler at the first loop bandwidth and the measurements from the signal sampler at the second loop bandwidth are received by the controller via the second interface.

3. The controller of claim 2, wherein a test pattern transmitted by the device under test is divided into blocks, the blocks are spaced throughout the test pattern, and each block contains a plurality of symbol transitions from which timing information is obtained by the signal sampler.

4. The controller of claim 3, wherein, when executed by the processor, the instructions cause the controller further to:
instruct, via the second interface, the signal sampler to collect samples from within each block at the first loop bandwidth; and
instruct, via the second interface, the signal sampler to collect samples from within each block at the second loop bandwidth.

5. The controller of claim 4, wherein, when executed by the processor, the instructions cause the controller further to:
cross-correlate each block of symbols from the first loop bandwidth with each corresponding block of symbols from the second loop bandwidth to generate a cross-correlation sequence; and
analyze the cross-correlation sequence to optimize an alignment between the first loop bandwidth and the second loop bandwidth and identify an amount of time distortion introduced by the clock recovery unit.

6. The controller of claim 5, wherein, when executed by the processor, the instructions cause the controller further to:
determine a time-distortion profile for the signal from the device under test using interpolation between values determined for each block.

7. The controller of claim 6, wherein, when executed by the processor, the instructions cause the controller further to:
correct a waveform of the signal from the device under test in post-processing based on the time-distortion profile.

8. The controller of claim 6, wherein, when executed by the processor, the instructions cause the controller further to:
preload distortion into a timing system of the signal sampler based on the time-distortion profile.

9. The controller of claim 1, wherein the first loop bandwidth is set to exclude frequency components of a deterministic pattern of a test pattern transmitted by the device under test in a manner that the first loop bandwidth is below a lowest frequency of the frequency components of the deterministic pattern of the test pattern.

10. The controller of claim 1, wherein the second loop bandwidth is set to exhibit a phase noise characteristic of a clock at the device under test within the second loop bandwidth and used to transmit the signal from the device under test.

11. The controller of claim 2, wherein, when executed by the processor, the instructions cause the controller further to:
acquire a repeating waveform of the signal from the device under test at the first loop bandwidth and at the second loop bandwidth, and
correct the repeating waveform of the signal from the device under test in post-processing based on a time-distortion profile for the signal.

12. A tangible non-transitory computer-readable storage medium that stores a computer program, wherein the computer program, when executed by a processor, causes a controller to:
instruct, via a first interface, a clock recovery unit at a first loop bandwidth to provide a recovered clock to a signal sampler to measure a signal from a device under test;
instruct, via the first interface, the clock recovery unit at a second loop bandwidth wider than the first loop bandwidth to provide the recovered clock to the signal sampler to measure the signal from the device under test;
compare measurements from the signal sampler at the first loop bandwidth to measurements from the signal sampler at the second loop bandwidth; and
instruct, via the first interface, the clock recovery unit at a third loop bandwidth to provide the recovered clock to the signal sampler applying adjustments based on comparing the measurements from the signal sampler at the first loop bandwidth to measurements from the signal sampler at the second loop bandwidth.

13. The tangible non-transitory computer-readable storage medium of claim 12, wherein, when executed by the processor, the computer program further causes the controller to:
receive, via a second interface, the measurements from the signal sampler at the first loop bandwidth and the measurements from the signal sampler at the second loop bandwidth are received by the controller via the second interface.

14. The tangible non-transitory computer-readable storage medium of claim 13, wherein, a test pattern transmitted by the device under test is divided into blocks, the blocks are spaced throughout the test pattern, and each block contains a plurality of symbol transitions from which timing information is obtained by the signal sampler.

15. The tangible non-transitory computer-readable storage medium of claim 14, wherein, when executed by the processor, the computer program further causes the controller to:
instruct, via the second interface, the signal sampler to collect samples from within each block at the first loop bandwidth; and
instruct, via the second interface, the signal sampler to collect samples from within each block at the second loop bandwidth.

16. The tangible non-transitory computer-readable storage medium of claim 15, wherein, when executed by the processor, the computer program further causes the controller to:
cross-correlate each block of symbols from the first loop bandwidth with each corresponding block of symbols from the second loop bandwidth to generate a cross-correlation sequence; and
analyze the cross-correlation sequence to optimize an alignment between the first loop bandwidth and the second loop bandwidth and identify an amount of time distortion introduced by the clock recovery unit.

17. The tangible non-transitory computer-readable storage medium of claim 12,
wherein the first loop bandwidth is set to exclude deterministic frequency components of a repetitive test pattern transmitted by the device under test in a manner that the lowest frequency of the first loop bandwidth is below the lowest frequency of the deterministic frequency components of the repetitive test pattern.

18. The tangible non-transitory computer-readable storage medium of claim 12,
wherein the second loop bandwidth is set to exhibit a phase noise characteristic of a clock at the device under test within the second loop bandwidth and used to transmit the signal from the device under test.

19. A system, comprising:
a clock recovery unit; and
a controller, comprising: a first interface to a clock recovery unit that provides a recovered clock from the first interface to the clock recovery unit; a memory that stores instructions; and a processor that executes the instructions, wherein, when executed by the processor, the instructions cause the controller to:

instruct, via the first interface, the clock recovery unit at a first loop bandwidth to provide the recovered clock to a signal sampler to measure a signal from a device under test;

instruct, via the first interface, the clock recovery unit at a second loop bandwidth wider than the first loop bandwidth to provide the recovered clock to the signal sampler, to measure the signal from the device under test;

compare measurements from the signal sampler at the first loop bandwidth to measurements from the signal sampler at the second loop bandwidth; and instruct, via the first interface, the clock recovery unit at a third loop bandwidth to provide the recovered clock to the signal sampler applying adjustments based on comparing the measurements from the signal sampler at the first loop bandwidth to measurements from the signal sampler at the second loop bandwidth.

20. The system of claim 19, further comprising:

the signal sampler, wherein the signal sampler comprises an oscilloscope.

\* \* \* \* \*